United States Patent [19]

Jenkins et al.

[11] Patent Number: 5,684,718
[45] Date of Patent: Nov. 4, 1997

[54] METHOD AND APPARATUS FOR MONITORING THE OPERATION OF AN ELECTRIC GENERATOR

[75] Inventors: Maurice A. Jenkins; Edward D. Thompson, both of Casselberry, Fla.

[73] Assignee: Westinghouse Electric Corporation, Pittsburgh, Pa.

[21] Appl. No.: 605,246

[22] Filed: Feb. 12, 1996

[51] Int. Cl.[6] .................................................. G01L 1/00
[52] U.S. Cl. .................... 364/551.01; 364/508; 73/660; 324/772; 340/683
[58] Field of Search .................................. 364/505, 506, 364/550, 551.01, 508; 73/570, 649, 658, 660, 579, 577; 340/540, 679, 683; 324/537, 772; 310/51

[56] References Cited

U.S. PATENT DOCUMENTS

| | | | |
|---|---|---|---|
| 4,070,750 | 1/1978 | Brennan et al. | 29/596 |
| 4,218,614 | 8/1980 | Miller | 250/231 |
| 4,302,813 | 11/1981 | Kurihara et al. | 364/508 |
| 4,321,464 | 3/1982 | Miller | 250/231 R |
| 4,402,054 | 8/1983 | Osborne et al. | 364/554 |
| 4,889,133 | 12/1989 | Nelson et al. | 128/681 |
| 4,988,979 | 1/1991 | Sasaki et al. | 340/683 |
| 5,109,700 | 5/1992 | Hicho | 73/660 |
| 5,146,776 | 9/1992 | Twerdochlib et al. | 364/571.02 |
| 5,311,562 | 5/1994 | Palusamy et al. | 376/215 |

*Primary Examiner*—Emanuel T. Voeltz
*Assistant Examiner*—Craig Steven Miller
*Attorney, Agent, or Firm*—R. P. Lenart

[57] ABSTRACT

A method and apparatus are provided for monitoring the operating conditions of an electric generator by producing a signal representative of vibration amplitude in end turns of stator windings of the generator; producing a signal representative of an electrical load under which said generator is operating; comparing the vibration and load signals to store reference data representative of normal or abnormal operating conditions; and producing an output signal based on a comparison of the vibration and load signals with the stored reference data. The output signal is representative of the operational status of the generator.

7 Claims, 3 Drawing Sheets

METHOD AND APPARATUS FOR MONITORING THE OPERATION OF AN ELECTRIC GENERATOR

BACKGROUND OF THE INVENTION

This invention relates generally to methods and apparatus for monitoring the operation of electrical equipment, and more particularly to such methods and apparatus for diagnosing the operating status of electrical generators.

Fiber Optic Vibration Monitors (FOVM) have been used to measure vibration at various sites on the stator end windings of electrical generators in power generation plants. Exciter-end and turbine-end end-turns of electric generators are consolidated into semi-rigid baskets to prevent damaging effects of vibration resulting from mechanical and electromagnetic forces created during operation. Vibration sensors monitor end-turn vibration to provide warning signals when destructive levels of vibration exist or when the vibration level is increasing. The vibration may then be controlled through load management or a change in coolant gas temperature until an outage can be scheduled for the generator.

U.S. Pat. No. 5,146,776, titled "Method For Continuously Calibrating An Optical Vibration Sensor", discloses a system for automatically calibrating a fiber optic vibration monitor employing a cantilever-mounted grid attached to the generator. The grid interrupts a light beam at a frequency directly proportional to the sensor's vibrational amplitude at a singular driving frequency (e.g. 120 Hz). Examples of fiber optic vibration sensors are shown in U.S. Pat. Nos. 4,321, 464 and 4,218,614. A typical electric generator monitor system may have a number of vibration alarms tied to different vibration sensors positioned over the end windings of a generator.

When vibration is deemed excessive, an alarm is sounded in a control room to warn the plant operator. The operator must then decide whether the alarm is meaningful to determine if a forced outage should be declared, if the situation should be monitored further to gain more information, or if the alarm should be dismissed as insignificant. When an alarm occurs, the operator must dedicate the time to track and analyze trend plots of the vibration points. The operator must be experienced in the interpretation of vibration plots to evaluate the significance of the alarm. Alternatively, vibration information can be delivered to a remote diagnostic center where experts can use their experience to render interpretations of the data and to make operating recommendations. In either case, the interpretation of the vibration data occurs well after the alarm condition, possibly allowing the problem to worsen before corrective action can be taken.

Current market demands are leading toward more independent operation of power plants, labor cost reduction, and extended operation between outages. The trend toward independent operation provides greater demand for stand alone diagnostic systems, and reducing labor costs means that plant employees with less experience will be expected to make judgments about vibration levels, safe operation, and information transmittal that may affect the timing of outages.

It is therefore desirable to provide diagnostic equipment that reduces the need for operator interpretation of vibration data.

SUMMARY OF THE INVENTION

This invention provides a method and apparatus for monitoring the operational status of an electric generator which correlates operating electric load of the generator with vibration data collected at various sensor points on the stator end windings.

Monitoring systems which operate in accordance with this invention monitor the operating conditions of an electric generator by producing a first signal representative of vibration amplitude in end turns of stator windings of the generator; producing a second signal representative of an electrical load under which said generator is operating; comparing the first and second signals with stored reference data; and producing an output signal based on the comparison, wherein the output signal is representative of the operating status of the generator. The reference data is representative of both vibration and electric load of the generator.

Systems for monitoring the operating conditions of an electric generator, constructed in accordance with this invention include means for producing a first signal representative of vibration amplitude in end turns of stator windings of the generator; means for producing a second signal representative of an electrical load under which the generator is operating; means for comparing the first and second signals with stored reference data and for producing an output signal in response to the comparison, wherein the output signal is representative of the operating status of the generator.

DETAILED DESCRIPTION OF THE INVENTION

Figure 1:
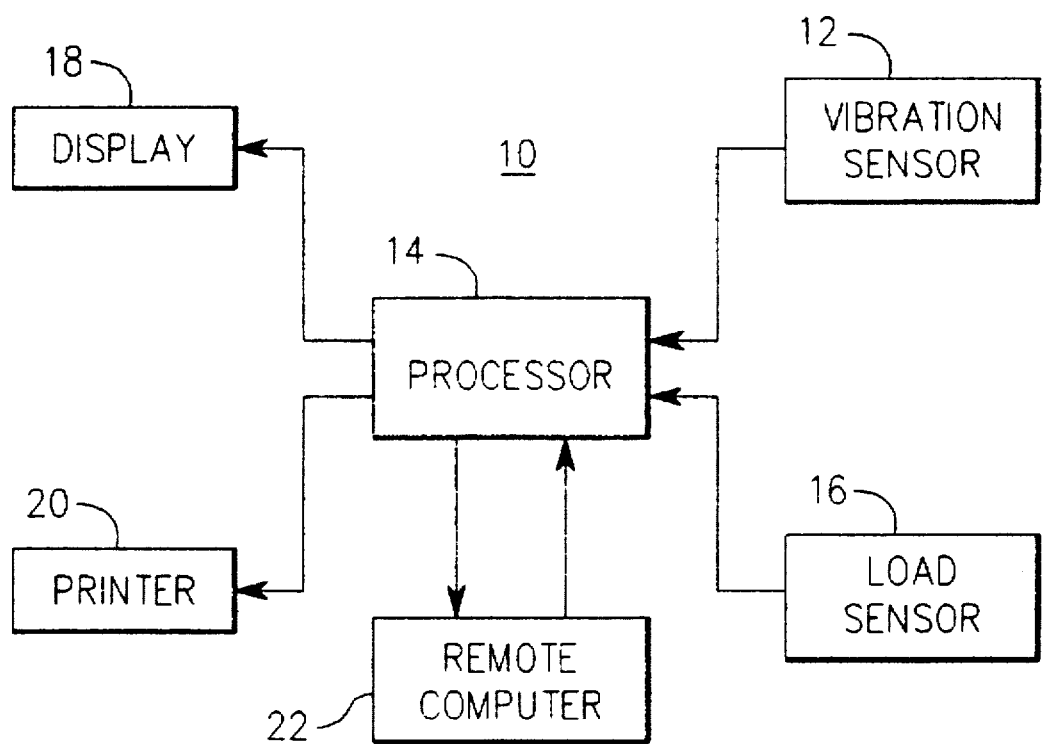
FIG. 1 is a block diagram of a monitoring system constructed in accordance with this invention.

Referring to the drawings, FIG. 1 is a block diagram of a monitoring system 10 constructed in accordance with this invention. A vibration sensor 12, which is preferably a fiber optic vibration sensor such as that shown in U.S. Pat. No. 4,321,464, is mounted within a generator to provide a signal representative of the vibration of the end turns of the stator windings of the generator. The vibration signal, which would typically represent peak-to-peak vibration amplitude levels, is fed to a data processor 14. A signal representative of the electrical load on the generator is also supplied to the processor, as schematically represented by load sensor 16. The load signal may be an analog or digital signal representative of the power being produced by the generator, or its percent of rated load. The processor, which may take the form of a computer, compares the vibration and load signals to one or more reference levels to make a determination of the operational status of the generator.

The processor contains stored information relating to acceptable and/or unacceptable levels of vibration at various generator load levels. This information may be in the form of an expert database which can be updated based on the operating history of the particular generator being monitored. The database may include data on the length of time that the generator should operate at a particular vibration level, acceptable vibration levels at various loads, acceptable maximum vibration levels, etc. The processor compares the measured vibration and load to the stored data and produces an output indicative of the operational status of the generator. A display 18 and/or printer 20 receive output signals from the processor so that they can be presented to an operator.

The processor would store benchmark load versus vibration curves when this feature is invoked by a plant operator.

This process would preferably be implemented at a time when vibration is deemed normal. Maximum acceptable vibration level versus load curves would then be calculated by the processor.

The comparison of measured vibration and load data with the stored data can be accomplished in a number of ways. For example, the stored data may be in the form of a set of data representing acceptable maximum vibration levels for a variety of load levels. The measured load would then be used to find the applicable maximum acceptable vibration level, and the measured vibration would be compared to that applicable maximum acceptable vibration level. Alternatively signals representative of the measured vibration and load could be combined to produce a single signal which is then compared to stored data that is representative of the a maximum acceptable combination of the two parameters.

An integration operator in the software can be used to keep track of vibration duration above accepted limits of copper fatigue. The system can then issue a series of diagnostic warnings as high vibration time occurs. The signals may also be processed to determine how far vibration exceeds limits and the length of time at the current vibration.

In one embodiment, the invention could use vibration input data from an existing fiber optic vibration monitor, and that data could be input to a computer 22 that also receives load data. The computer would then display the diagnosis. The data display would most likely include all current vibration levels and the expected vibration for each location in a table format. There may also be an area on the display that would show the top three messages, with a scrolling capability in case there are more than three messages.

Alternatively, the data could be fed to a remote computer that would store it and download it to a local computer on demand. Plots and English text diagnosis could be displayed on the local computer monitor and/or printed on a local printer.

Figure 2A:
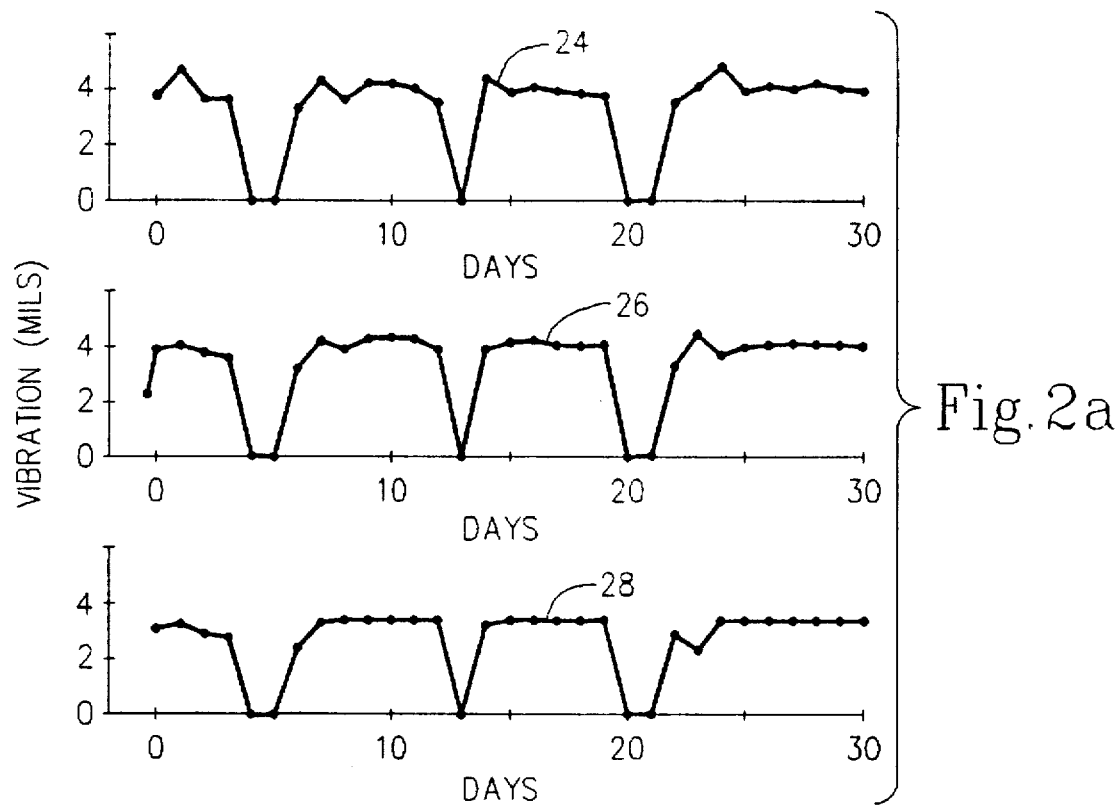
FIGS. 2a and 3a are vibration charts representative of the vibration of an electric generator.
Figure 2B:
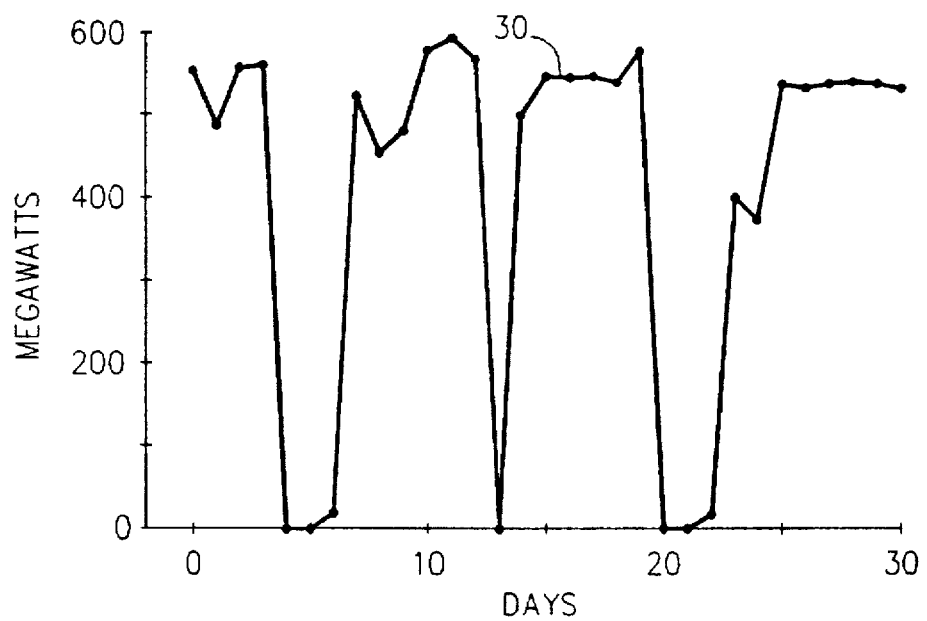
FIGS. 2b and 3b are load charts representative of the load of an electric generator.

FIGS. 2a and 2b show some of the information that this invention can automatically analyze. The vibration plot in FIG. 2a is composed of data points that show the maximum peak-to-peak vibration (in mils) of a stator end winding of an electric generator on successive days of a thirty day period at three sensor locations, as illustrated by lines 24, 26 and 28. FIG. 2b shows the maximum load on the generator for the same time period, as illustrated by line 30. When the plot of maximum load is compared to the plot of maximum vibration, a correlation between load and vibration is made. The plots of FIGS. 2a and 2b show normal performance, where the data indicates that the stator end winding is tight as shown by the modest vibration increase as load increases.

Figures 3A, 3B:
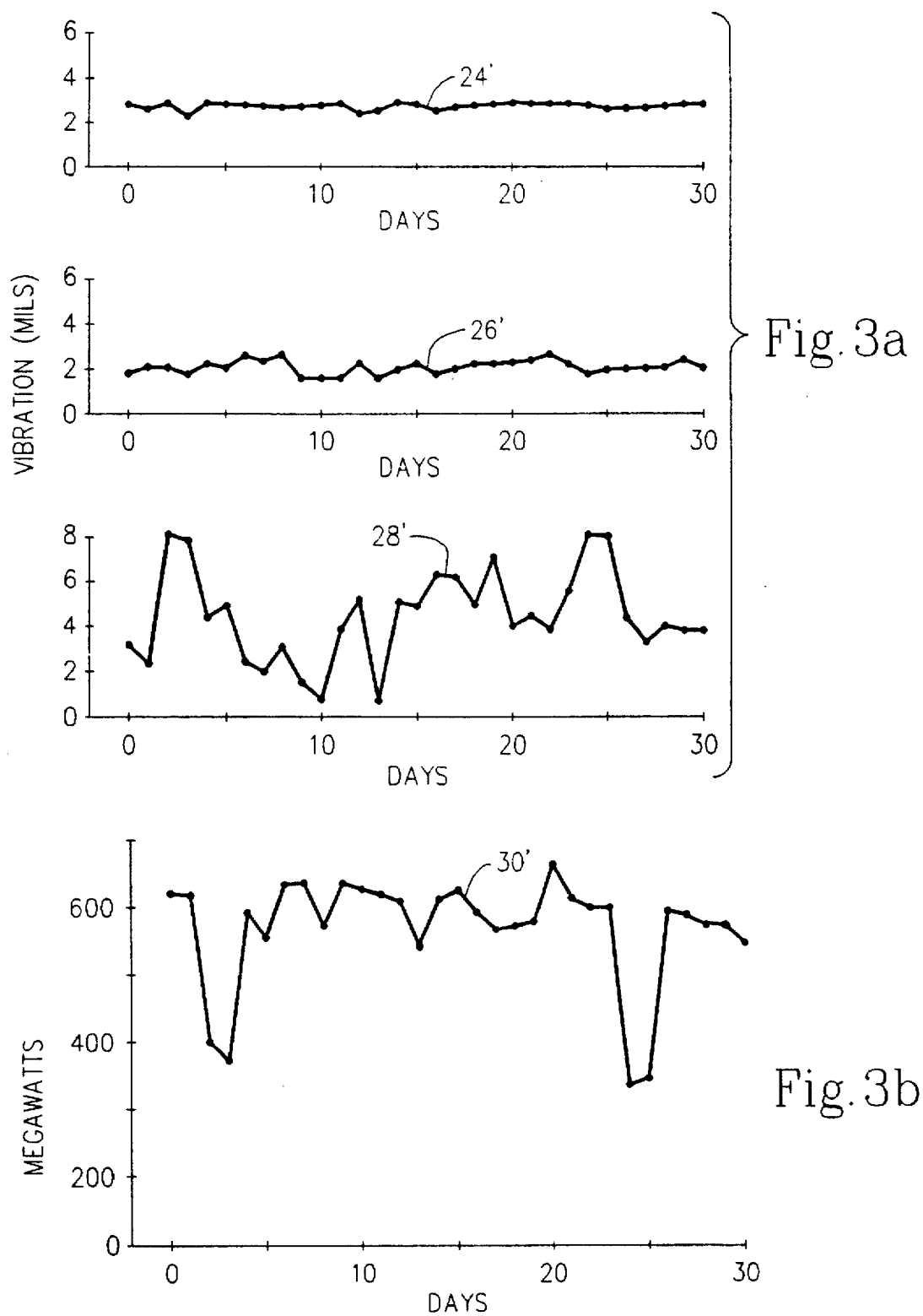

The vibration plot in FIG. 3a is composed of data points that show the maximum peak-to-peak vibration (in mils) of the stator end winding of the electric generator over a second thirty day time period at the three sensor locations, as illustrated by lines 24', 26' and 28' FIG. 3b shows the maximum load for each day, as shown by line 30'. The significant increase in vibration for a given change in load as shown by the vibration illustrated in line 28' indicates a loose stator winding. In FIGS. 2a, 2b, 3a and 3b, the change in data has been exaggerated for illustration purposes.

This invention is also capable of detecting an abnormal operating condition of a generator, even though vibration levels are within normal tolerances. For example, an anomalous condition would be diagnosed if, for example, vibration at full load were 3 mils but increased to 7 mils at 70% load (although 7 mils is within the normal range). The diagnosis would be that a resonant frequency existed at 70% load, which is indicative of winding looseness. Increased vibration at a particular load point would indicate undesirable resonance. For example, in FIG. 3a, high points on line 28' at the third, fourth, twenty-fifth and twenty-sixth days correlate with operation at or near 300 MW.

If vibration increased uniformly with load, but is high at full load (though below the alarm threshold) the diagnosis would be general looseness of the end windings. If vibration is high over the whole load range, the diagnosis would be global looseness of the end winding structure. If the maximum or minimum output of any sensor exhibits short term spiking behavior and exceeds a certain level, loose parallel rings may be the reason, e.g. the parallel ring support may be impacting on end windings. Transient, rapidly changing vibration (sometimes referred to as "spiking vibration") can be detected by monitoring the change in vibration with respect to time.

Interpretation of vibration data and correlation with load is important because, spiking vibration levels (below alarm levels) that correlate with a load point indicate localized looseness in an end winding. Operation of the generator could be extended by avoiding prolonged running at this load. Spiking vibration levels (below alarm levels) that increase over time indicate a worsening condition that should be watched closely. Differences seen before and after an outage affirm that a problem has been solved or warn that a problem is starting. High vibration levels (below alarm levels) by many sensors indicate global looseness of the end windings. Low vibration levels that increase modestly with load confirm satisfactory consolidation in the end windings.

This invention provides a fiber optic vibration monitor (FOVM) that correlates operating load with vibration data collected at various points on the stator end windings of an electric generator. One embodiment of the invention, stores data on the maximum vibration levels over different load ranges and analyzes this data according to an expert data base. Rules in the self-updating expert database may result from the accumulation of unit/years of experience and observation, plus the operating history of the particular generator. The monitoring system can continuously and automatically produce diagnostic messages about the condition of the stator windings as derived by the logic within the system after analysis of the monitoring data. Problems can be detected well before the alarm state. This can give an operator time to make adjustments in the generator operating conditions, to minimize damage that might otherwise result from excessive vibration.

This invention uses stored data which may be based on experience with vibration and load information on similar generators, and can update the stored data based on the operating history of a particular generator. Recalibration can be achieved without resetting when the baseline data is not reached for an extended period of time. The system will then recalibrate itself to a lower baseline using internal logic.

By reducing or eliminating the need to interpret alarms, this invention enables more cost effective, independent, power plant operation; requires fewer plant personnel at a lower skill level; detects vibration induced problems before alarm levels conditions are reached; and enables longer operation between outages by pinpointing problem load points.

While specific embodiments of the invention have been described in detail, it will be appreciated by those skilled in the art that various modifications and alternatives to those details could be developed in light of the overall teachings of the invention. Accordingly, the particular arrangements disclosed are meant to be illustrative only and not limiting as to the scope of the invention which is to be given the full breadth of the appended claims and any and all equivalents thereof.

We claim:

1. A method for monitoring the operating conditions of an electric generator, said method comprising the steps of:

producing a first signal representative of vibration amplitude in end turns of stator windings of the generator;

producing a second signal representative of an electrical load under which said generator is operating;

comparing said first and second signals to stored reference data; and producing an output signal based on the results of the comparing step, said output signal being representative of the operational status of the generator.

2. A method for monitoring the operating conditions of an electric generator, as recited in claim 1, wherein the step of comparing said first and second signals to stored reference data includes the steps of:

storing benchmark load versus vibration curves representative of maximum acceptable vibration versus load; and comparing the first and second signals to the benchmark vibration curves.

3. A method for monitoring the operating conditions of an electric generator, as recited in claim 1, further comprising the steps of:

using said first and second signals to adjust the stored reference data for future comparisons.

4. A method for monitoring the operating conditions of an electric generator, as recited in claim 1, wherein the reference data is representative of both vibration amplitude and operating load of the generator.

5. A system for monitoring the operating conditions of an electric generator, said system comprising:

means for producing a first signal representative of vibration amplitude in end turns of stator windings of the generator;

means for producing a second signal representative of an electrical load under which said generator is operating;

means for comparing said first and second signals to reference data; and means for producing an output signal based on a comparison of said first and second signals with said reference data, said output signal being representative of the operational status of the generator.

6. A system for monitoring the operating conditions of an electric generator, as recited in claim 5, further comprising:

means for using said first and second signals to adjust the stored reference data for future comparisons.

7. A system for monitoring the operating conditions of an electric generator, as recited in claim 5, wherein the means for producing a first signal representative of vibration amplitude is a fiber optic vibration sensor.

* * * * *